(12) United States Patent
Suzuki (10) Patent No.: US 6,452,422 B1
(45) Date of Patent: Sep. 17, 2002

(54) INTERFACE CIRCUIT AND OPERATING METHOD THEREOF

(75) Inventor: Yasufumi Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/578,714

(22) Filed: May 26, 2000

(30) Foreign Application Priority Data

May 28, 1999  (JP) .......................................... 11-149787

(51) Int. Cl.[7] .......................................... H03K 19/094
(52) U.S. Cl. .......................................... 326/112; 326/83
(58) Field of Search .......................... 326/112, 82, 83, 326/86, 62; 327/538–541, 543, 276, 281

(56) References Cited

U.S. PATENT DOCUMENTS

| | | | |
|---|---|---|---|
| 4,068,134 A | * | 1/1978 | Tobey, Jr. et al. .......... 327/541 |
| 4,763,021 A | * | 8/1988 | Stickel ......................... 326/71 |
| 5,012,141 A | * | 4/1991 | Tomisawa ................... 327/276 |
| 5,047,657 A | * | 9/1991 | Seevinck et al. ........... 327/306 |
| 5,739,712 A | * | 4/1998 | Fujii ............................ 327/323 |
| 5,939,937 A | * | 8/1999 | Terletzki ..................... 327/541 |

FOREIGN PATENT DOCUMENTS

| | | |
|---|---|---|
| JP | 61-244120 | 10/1986 |
| JP | 2-27807 | 1/1990 |
| JP | 3-283713 | 12/1991 |
| JP | 5-327472 | 12/1993 |
| JP | 6-326591 | 11/1994 |
| JP | 9-8637 | 1/1997 |

* cited by examiner

*Primary Examiner*—Michael Tokar
*Assistant Examiner*—James H Cho
(74) *Attorney, Agent, or Firm*—Whitham, Curtis & Christofferson, P.C.

(57) ABSTRACT

An interface circuit has a load, a driving circuit, and a bias circuit and outputs an output signal in accordance with an input signal between both ends of a load resistor. The driving circuit has a first MOS transistor which supplies a first constant current and a bridge circuit which supplies the first constant current to the load switchingly. The bias circuit has a fixed resistor, a second MOS transistor which is connected with the fixed resistor and which is operable with the first transistor under a Miller effect; and a differential amplifier whose non-inverting input terminal receives a predetermined voltage whose inverting input terminal receives a voltage of a connection node between the second transistor and the fixed resistor, and an output terminal which applies an output voltage at the control terminals of the first and second transistor.

9 Claims, 7 Drawing Sheets

INTERFACE CIRCUIT AND OPERATING METHOD THEREOF

BACKGROUND OF THE INVENTION

1. Field of the Invention

The present invention relates to an interface circuit which transmits a digital signal at a high speed.

2. Description of the Related Art

Recently, it is increasingly demanded that interface circuits, employed in I/O sections of semiconductor integrated circuits, be operated at a high speed with less noise. Examples of high-speed interface circuits are a small-amplitude differential output circuit, typically known as an LVDS (Low Voltage Differential Signalling), and a small-amplitude output circuit, typically known as a GTL (Gunning Transceiver Logic) or an HSTL (High Speed Transceiver Logic).

Figure 1:
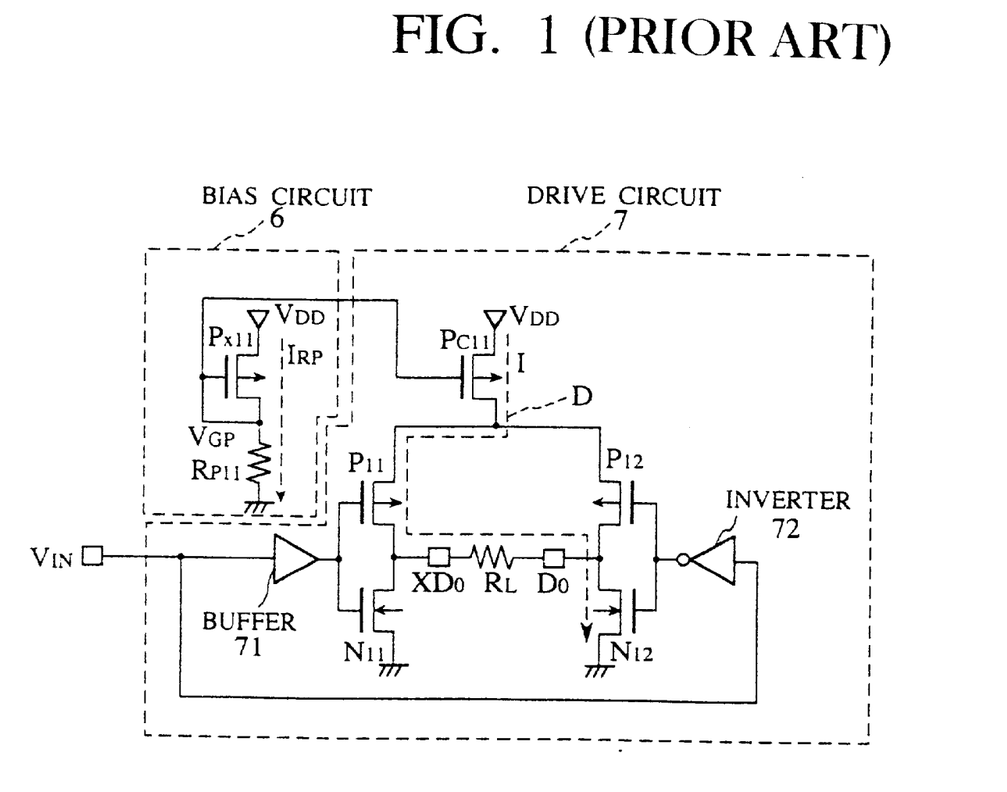
FIG. 1 is a circuitry diagram showing the structure of the first example of an interface circuit.

FIG. 1 is a circuitry diagram showing the structure of an example of an LVDS type interface circuit. The first example of the interface circuit comprises: a drive circuit 7 which differentially outputs an output signal in accordance with an input signal $V_{IN}$ to a terminating resistor $R_L$ connected between two output terminals $D_O$ and $X_{DO}$; and a bias circuit 6 which controls an output current I of the drive circuit 7.

The drive circuit 7 comprises: a buffer 71 which performs non-inverting output of an input signal $V_{IN}$; an inverter 72 which performs inverting output of an input signal $V_{IN}$; a P-channel MOSFET (hereinafter referred to as an P-MOSFET) $P_{11}$ and an N-channel MOSFET (hereinafter referred to as an N-MOSFET) $N_{11}$ which are driven by the buffer, a P-MOSFET $P_{12}$ and an N-MOSFET $N_{12}$ which are driven by the inverter, and a P-MOSFET $P_{C11}$ which serves as a constant current source for making a predetermined output current flow to the terminating resistor $R_L$ connected between the two output terminals $D_O$ and $X_{DO}$.

The bias circuit 6 comprises: a fixed resistor $R_{P11}$; and a P-MOSFET $P_{X11}$ which constantly controls a current $I_{RP}$ to flow to the fixed resistor $R_{P11}$.

In such a structure, when the input signal $V_{IN}$ is at a low level, the P-MOSFET $P_{11}$ is ON, and the N-MOSFET $N_{11}$ is OFF, the P-MOSFET $P_{12}$ is OFF, and the N-MOSFET $N_{12}$ is ON. Thus, as described iwth arrow D in FIG.> 1, the output current I flows through a path along the P-MOSFET $P_{C11}$, the P-MOSFET $P_{11}$ and the N-MOSFET $N_{12}$. At his time, a low level voltage ($V_{CL}$) is out put to the output terminal $D_O$, whereas a high level voltage ($V_{OH}$) is out put to the output terminal $X_{DO}$.

In the first example of the interface circuit, the P-MOSFET $P_{X11}$ and the P-MOSFET $P_{C11}$ operate in their saturation range, and the dimensions of the respective transistors are designed such that constants of the transistors are set at a predetermined ratio. In this structure, the P-MOSFET $P_{X11}$ and the P-MOSFET $P_{C11}$ operate under the Miller effect, thus a current $I_{RP}$ flowing through the P-MOSFET $P_{X11}$ and a current I flowing through the P-MOSFET $P_{C11}$ are in proportion to each other Accordingly, when having the structure of the bias circuit 6 as shown in FIG. 1, any variation in the current $I_{RP}$ which may occur as a result of a variation in the source voltage $V_{DD}$ or any difference (deviation) occurring in transistors in the manufacturing processes can be reduced. In addition, a variation in the output current I of the drive circuit 7 which is in proportion to the current $I_{RP}$ of the bias circuit 6 can be reduced.

Figure 2:
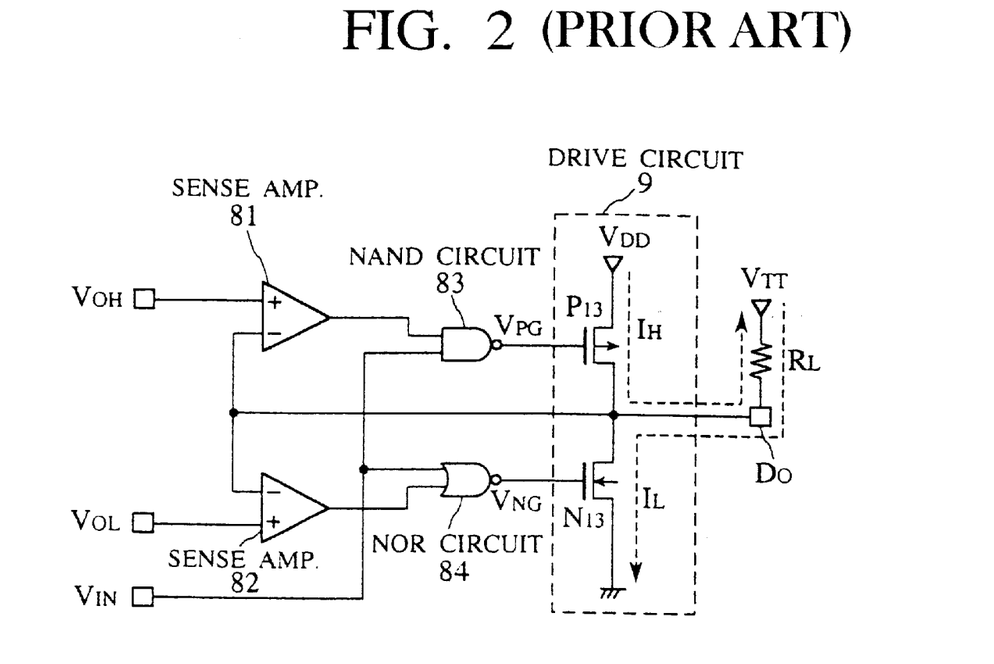
FIG. 2 is a circuitry diagram showing the structure of the second example of an interface circuit.

FIG. 2 is a circuitry diagram showing the structure of the second example of an interface circuit which is disclosed in Unexamined Japanese Patent Application KOKAI Publication No. H3-283713. The second example of the interface circuit shown in FIG. 2 comprises: a drive circuit 9 comprising a P-MOSFET $P_{15}$ and an N-MOSFET $N_{13}$ which are connected in series between a power source $V_{DD}$ and a ground potential; an NAND circuit 83 which supplies the P-MOSFET $P_{13}$ in the drive circuit 9 with a gate voltage $V_{PO}$; a NOR circuit 84 which supplies the N-MOSFET $N_{13}$ with a gate voltage $V_{NG}$; and a sense amplifier 81 and a sense amplifier 82 which control a voltage of an output terminal $D_O$ in the drive circuit 9 to be in a predetermined value. The output terminal $D_O$ is connected to a reference voltage $V_{TT}$ along a transmission path via a terminating resistor $R_L$.

In such a structure, a control voltage $V_{OH}$ for controlling a voltage of the output terminal $D_O$ in the drive circuit 9 into a high level is input to a non-inverting input terminal of the sense amplifier 81 serving as a differential amplifier. A control voltage $V_{OL}$ for controlling a voltage of the output terminal $D_O$ in the drive circuit 9 into a low level is input to a non-inverting input terminal of the sense amplifier 82 serving as a differential amplifier.

The voltage of the output terminal $D_O$ is fed back to inverting input terminals of the respective sense amplifiers 81 and 82. Thus, the sense amplifier 81 controls the voltage of the output terminal $D_O$ to a voltage level of $V_{OH}$, whereas the sense amplifier 82 controls the voltage of the output terminal $D_O$ to a voltage level of $V_{OL}$.

Either one of the NAND circuit 83 and the NOR circuit 84 supplies the MOSFET included in the drive circuit 9 with a gate voltage, in accordance with the conditions of the input signal $V_{IN}$. The output voltages of the respective NAND circuit 83 and NOR circuit 84 are so controlled that their voltage values are in proportion to the value of the output voltages of the respective sense amps 81 and 82.

Therefore, when the input signal $V_{IN}$ is at a high level, the voltage of the output terminal $D_O$ is controlled to be at a voltage level of $V_{OH}$ by the sense amp 81, resulting in making the current $I_H$ flow to the terminating resistor $R_L$. On the contrary, when the input signal $V_{IN}$ is at a low level, the voltage of the output terminal $D_O$ is controlled at a voltage level of $V_{OL}$, resulting in making the current $I_L$ flow to the terminating resistor $R_L$.

Accordingly, having controlled the output current $I_L$ or $I_H$ to flow to the terminating resistor $R_L$ in accordance with the conditions of the input signal $V_{IN}$, the voltage of the output terminal $D_O$ varies.

In the first example of an interface circuit shown in FIG. 1, a variation of the current $I_{RP}$, resulting from a source voltage variation or any difference occurring in transistors in the manufacturing processes, can not sufficiently be reduced. This entails problems that a current variation is large in the output current I and an amplification variations is also large in the output voltage.

Variations in the current $I_{RP}$, which variations occur in the bias circuit as a result of a variation in a source voltage or any difference occurring in transistors in the manufacturing processes, will now be explained with reference to FIGS. 3 and 4.

Figure 3:
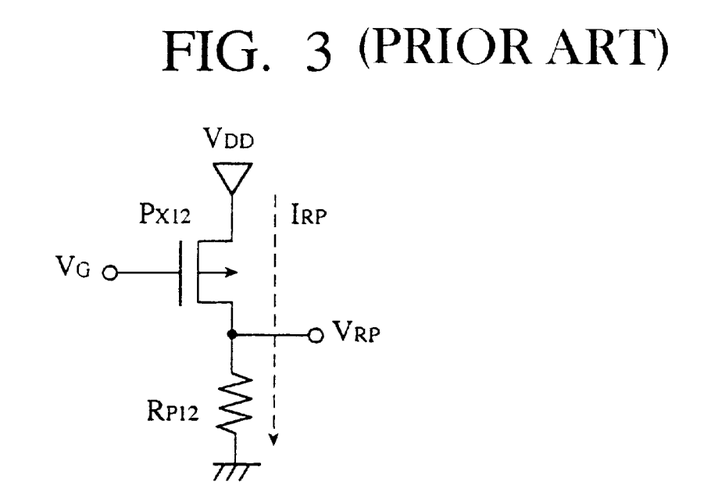
FIG. 3 is a circuitry diagram showing an example of the structure of a bias circuit.
Figure 4:
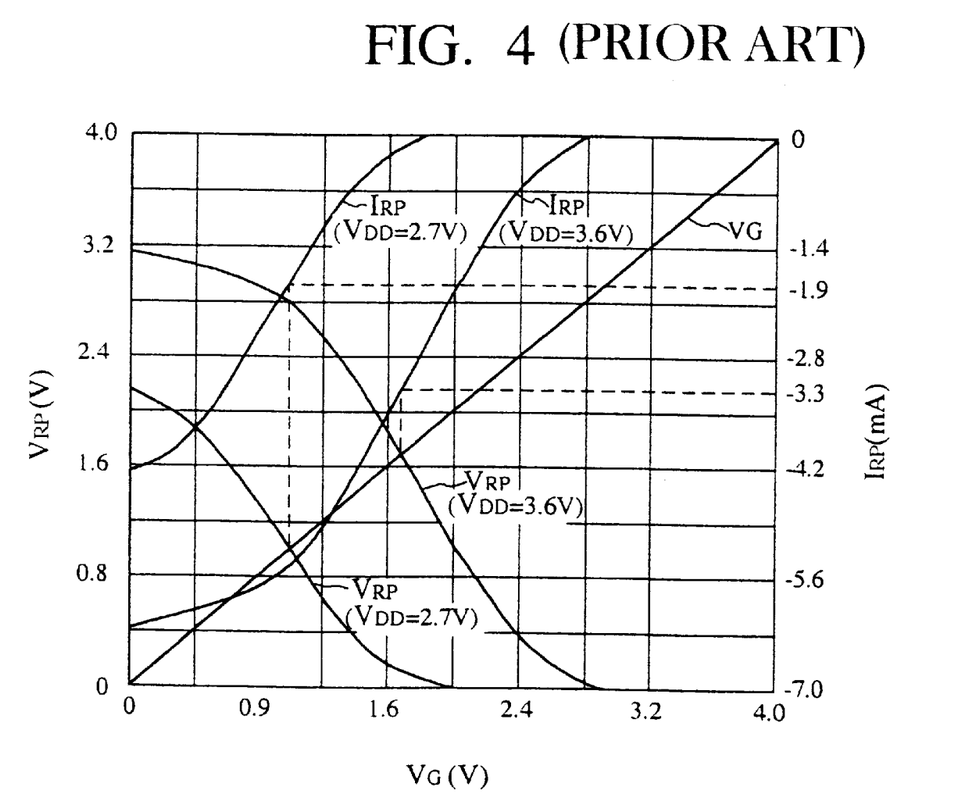
FIG. 4 is a graph showing the characteristics of an output current and an output voltage with a reference voltage of a gate voltage to be applied onto the bias circuit shown in FIG. 3.

FIG. 3 is a circuitry diagram showing the structural example of a bias circuit employed in an interface circuit. FIG. 4 is a graph showing characteristics of output currents and output voltages with reference voltage of a gate voltage to be applied to the bias circuit illustrated in FIG. 3.

In the bias circuit shown in FIG. 3, a P-MOSFET $P_{X12}$ and a fixed resistor $R_{P12}$ are connected in series between a power source $V_{DD}$ and a ground potential. In such a structure, when the power source $V_{DD}$ is set at 3.6 V or 2.7 V, the relationship between the current $I_{RP}$ and the output voltage $V_{RP}$ with reference to the gate voltage $V_O$ is as shown in FIG. 4.

In the first example, as shown in FIG. 1, of the bias circuit, the gate voltage and the drain voltage of the P-MOSFET $P_{X11}$ are the same ($V_{GP}$). Accordingly, based on the characteristics shown in FIG. 4, the current $I_{RP}$ is −1.9 mA when the source voltage VDD is 2.7 V, whereas the current $I_{RP}$ is −3.3 mA when the source voltage $V_{DD}$ is 3.6 V.

Accordingly, in the bias circuit having the structure shown in FIG. 1, when the source voltage $V_{DD}$ varies from 2.7 V to 3.6 V, the output current I of the interface circuit which is in proportion to the current $I_{RP}$ varies as well.

In the second example of the interface circuit shown in FIG. 2, when the input signal $V_{IN}$ to be output, there is a delay before the voltage of the output terminal $D_O$ varies in response to the variation in the output voltage of the NAND circuit 83 or NOR circuit 84. Further, there is a delay before an output voltage of the NAND circuit or NOR circuit varies when the sense amp 81 or 82 responses to the variation in the voltage of the output terminal $D_O$. Accordingly, when the voltage of the output terminal $D_O$ is switched from $V_{OH}$ to $V_{OL}$ or from $V_{OL}$ to $V_{OH}$, a drawback is that a noise occurs.

Figure 5:
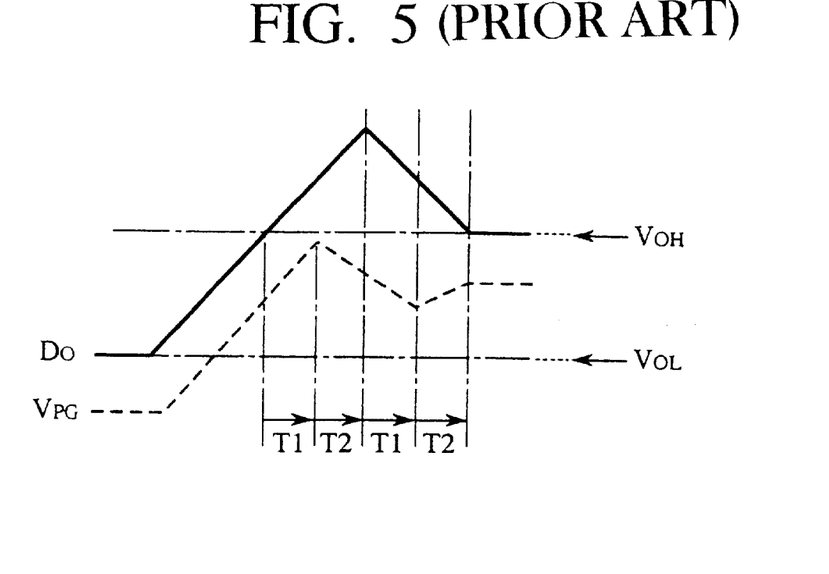
FIG. 5 is a waveform diagram showing operations of the interface circuit shown in FIG. 2.

FIG. 5 is a waveform diagram showing operations of the interface circuit shown in FIG. 2. Illustrated in FIG. 5 are the gate voltage of the output terminal $D_O$ and the gate voltage of the P-MOSFET, when the voltage of the output terminal $D_O$ switches from $V_{OL}$ to $V_{OH}$. As shown in FIG. 5, in response to switching of the voltage of the output terminal $D_O$ from $V_{OL}$ to $V_{OH}$, the sense amp 81 makes the output voltage $V_{PG}$ of the NAND circuit 83 vary with a delay of a delay period $T_1$, along with an increase in the voltage of the output terminal $D_O$. Hence, the voltage of the output terminal $D_O$ continuously increases during the period of $T_1+T_2$, even if it exceeds the control voltage $V_{OH}$, resulting in generating a spike noise. Similarly, when the voltage of the output terminal $D_O$ switches from $V_{OH}$ to $V_O$, a noise is generated.

In the second example of the interface circuit, two sense amps are necessary, causing a large size of the circuit to be manufactured.

As a technique having relevance to the present invention, for example, Unexamined Japanese Patent Application KOKAI Publication No. S61-244120 discloses a logical signal detecting output circuit which converts an output signal of a differential amplifier into an ECL level signal. Unexamined Japanese Patent Application KOKAI Publication No. H2-27807 discloses a technique for a differential amplifier, wherein the Miller capacitance is set small and the frequency characteristic of the amplifier is set at a broad band. Further, Unexamined Japanese Patent Application KOKAI Publication No. H5-327472 discloses an output circuit for obtaining a large driving current and voltage amplification. Unexamined Japanese Patent Application KOKAI Publication No. H6-326591 discloses an output circuit which can perform small-amplification operations to operate at a high speed. Furthermore, Unexamined Japanese Patent Application KOKAI Publication No. H9-8637 discloses an output circuit for outputting an accurate output signal without any high accuracy resistance. However, the techniques discloses in these publications do not solve the above mentioned problems of the first and second examples of the interface circuits.

SUMMARY OF THE INVENTION

The first object of the present invention is to provide an interface circuit, wherein a variation in an output current which variation occurs as a result of a variation in a source voltage or any difference occurring in transistors in the manufacturing processes, is controlled.

The second object of the present invention is to provide an interface circuit, wherein a variation in amplification of an output current, which variation occurs as a result of a variation in a source voltage or any difference occurring in transistors in the manufacturing processes, is controlled.

The third object of the present invention is to provide an interface circuit having a simple structure and being operable at speed.

The fourth object of the present invention is to provide an interface circuit wherein any noise is prevented from occurring and which is operable at speed.

In order to achieve the above-described objects, according to the first aspect of the present invention, there is provided an interface circuit which outputs an output signal in accordance with an input signal to at least one end of a load, the interface circuit comprising:

a load;

a driving circuit having a first resistor which supplies a first constant current to the load and a switching circuit which supplies the first constant current to the load; and a bias circuit having a fixed resistor, a second transistor which is connected with the fixed resistor and which is operable with the first transistor under a Miller effect, and a control circuit which controls a voltage applied to control terminals of the first and second transistor and an output voltage of the second transistor to be at predetermined voltage ratio.

In the interface circuit.

each of the first and second transistor may include a current path and a control terminal;

the current path of the first transistor may be connected to the switching circuit;

the current path of the second transistor may be connected to the fixed resistor; and the interface circuit may comprise a differential amplifier whose non-inverting input terminal receives a predetermined voltage, and whose inverting input terminal receives a voltage of a connection node between the second transistor and the fixed resistor, and a output terminal which applies an output voltage at the control terminals of the first and second transistor.

In the interface circuit, the switching circuit may switch a flow direction of a current flowing through the load from one end to the other end and from the other end to the one end.

The interface circuit may further comprise:

a second driving circuit having a third transistor which supplies a second constant current to the load and a second switching circuit which supplies the second constant current to the load;

a second bias circuit having a second fixed resistor, a fourth transistor which is connected with the second fixed resistor and which is operable when the third transistor under a Miller effect; and a second control circuit which controls a voltage applied to the control terminals of the third and fourth transistors and an output voltage of the fourth transistor to be at a predetermined voltage ratio.

In the interface circuit:

each of the third and fourth transistors may include a current path and a control terminal;

the current path of the third transistor may be connected to the second switching circuit;

the current path of the fourth transistor may be connected to the second fixed resistor;

the interface circuit further may comprise a second differential amplifier whose non-inverting input terminal receives a second predetermined voltage, and whose inverting input terminal receives a voltage of a connection node between the fourth transistor and the second fixed resistor, and an output terminal which applies an output voltage at the control terminals of the third and fourth transistors.

In the interface circuit, the first and second transistors may respectively comprise P-channel MOS FETs or N-channel MOS FETS.

In the interface circuit:

each of the first and second transistors may respectively comprise P-channel MOS FETs or N-channel MOS FETS: and the third and fourth transistors may respectively comprise N-channel MOS FETs or P-channel MOS FETs.

According to the second aspect of the present invention, there is provided an operating method of an interface circuit which outputs an output signal in accordance with an input signal to at least one end of a load, the operating method comprising:

controlling and applying a common voltage to gates of a first transistor and a second transistor whose current path is connected to a resistor so that a voltage at a connection point of the resistor and the second transistor is a predetermined value, thereby to make the first and second transistors operate under a Miller effect; and supplying, in response to an input signal, a current which flows through the first transistor to a load, thereby outputting an output signal between both ends of the load or at one end of the load.

The operating method of an interface circuit may further comprise:

controlling and applying a second common voltage to gates of a third transistor and a fourth transistor whose current path is connected to a second resistor so that a voltage at an connection point of the second resistor and the fourth transistor is second predetermined value, thereby to make the third and fourth transistor operate under a Miller effect; and supplying, in response to an input signal, a current which switchingly flows through the first transistor and the third transistor to the load.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

Explanations will now specifically be made to embodiments of the present invention with reference to the drawings.

First Embodiment

Figure 6:
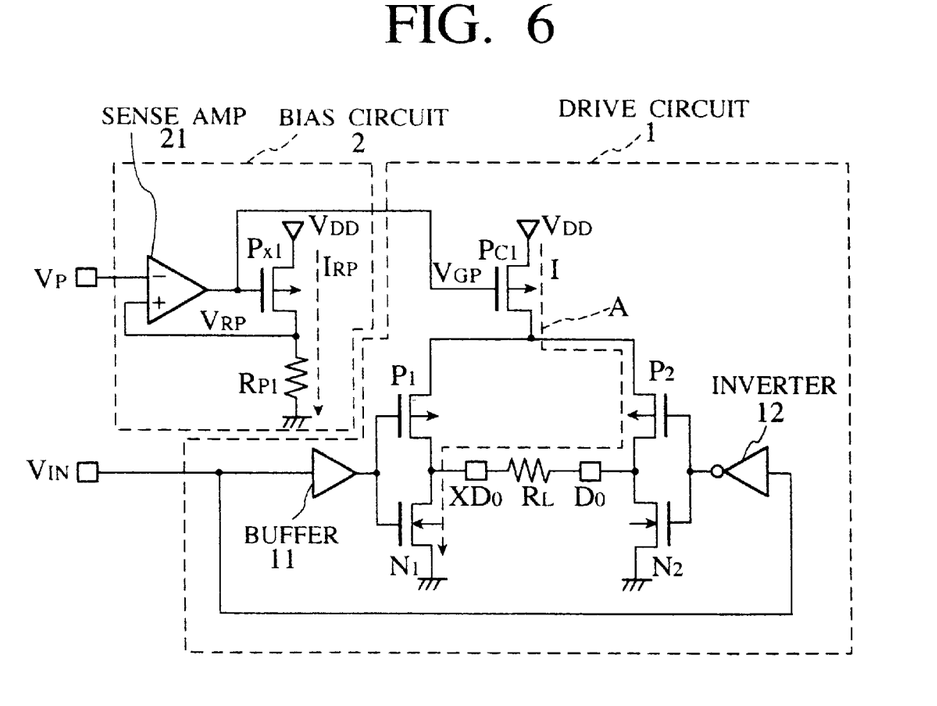
FIG. 6 is a circuitry diagram showing the structure of an interface circuit according to the first embodiment of the present invention.

FIG. 6 is a circuitry diagram showing the structure of the interface circuit according to the first embodiment of the invention. The interface circuit, illustrated in FIG. 6, according to the first embodiment comprises: a drive circuit 1 which differentially outputs an output signal in accordance with an input signal $V_{IN}$ to a terminating resistor $R_L$ which is connected between two output terminals $D_O$ and $X_{DO}$; and a bias circuit 2 which constantly controls an output current I applied to the drive circuit 1.

The drive circuit 1 comprises: a buffer 11 which performs non-inverting output of an input signal $V_{IN}$; an inverter 12 which performs inverting output of an input signal $V_{IN}$; an P-MOSFET $P_1$ and an N-MOSFET $N_1$ which are activated by the buffer 11; a P-MOSFET $P_2$ and an N-MOSFET $N_2$ which are activated by the inverter 12; and a P-MOSFET $P_{CL}$ which serves as a constant current source for making a given output current I flow to and through the terminating resister $R_L$ connected between the two output terminals $D_O$ and $X_{DO}$.

The bias circuit 2 comprises: a fixed resistor $R_{P1}$ which is connected between a power source $V_{DD}$ and a ground potential in series; a P-MOSFET $P_{X1}$ which is connected between the power source $V_{DD}$ and the fixed resistor $R_{P1}$ for controlling a current $I_{RP}$ constantly flowing to and through the fixed resistor $R_{P1}$; and a sense amp 21 for controlling a current $I_{RP}$ constantly flowing to and through the fixed resistor $R_{P1}$.

Applied to an inverting input of the sense amp 2 is a control voltage $V_P$ for making a desired output current I flow to and through the terminating resister $R_L$. An output voltage $V_{RP}$ output from the P-MOSFET $P_{X1}$ is fed back to a non-inverting input of the sense amp 21. An output terminal of the sense amp 21 is connected to the gate of the P-MOSFET $P_{X1}$.

In the structure illustrated in FIG. 6, the sense amp 21, serving as a differential amplifier, operates in such a way that an output voltage $V_{RP}$ of the P-MOSFET $P_{X1}$ and a control voltage $V_P$ coincide with each other. The P-MOSFET $P_{X1}$ operates in a saturation range. Thus, the current $I_{RP}$ flowing through the fixed resistor $R_{P1}$ is controlled to regularly be constant, without being effected by any variation in the source voltage $V_{DD}$ or any difference occurring in transistors in the manufacturing processes.

In FIG. 6, the sense amp 21 has the structure, in which it operates in such a way that the output voltage $V_{RP}$ of the P-MOSFET $P_{X1}$ and the control voltage $V_P$ coincide with each other. However, the structure of the sense amp 21 is not limited to this, instead, the structure of the sense amp 21 may arbitrarily be determined as long as voltage values of the output voltage $V_{RP}$ of the P-MOSFET $P_{X1}$ and the control voltage $V_P$ are set at a predetermined ratio.

Figure 7:
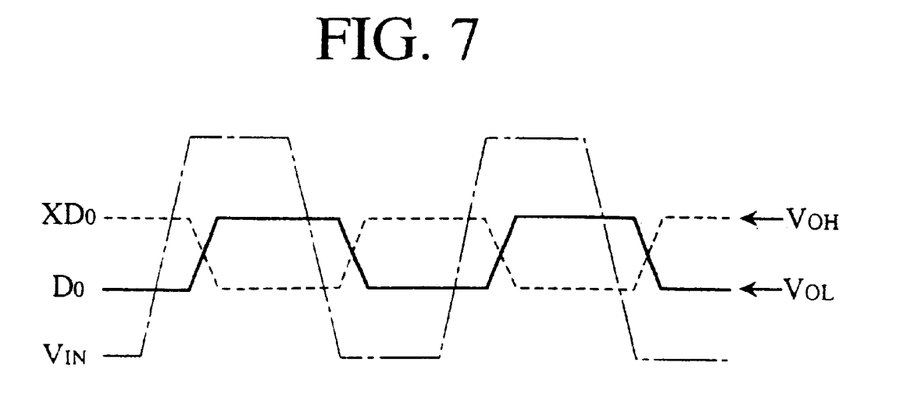
FIG. 7 is an input-output waveform diagram showing operations of the interface circuit shown in FIG. 6.

FIG. 7 is an input-output waveform diagram showing operations of the interface circuit shown in FIG. 6. As illustrated in FIG. 7, when an input signal $V_{IN}$ is at a high level, any output signal from the buffer 11 is at a high level, while any output signal of the inverter 12 is at a low level. In this structure, the P-MOSFET $P_1$ is OFF, the N-MOSFET $N_1$ is ON, the P-MOSFET $P_2$ is ON and the N-MOSFET $N_2$ is OFF. Hence, the output current I flows, as described with an arrow A in FIG. 6, through a path along the P-MOSFET $P_{C1}$, the P-MOSFET $P_2$ and the N-MOSFET $N_1$. At this time, a high level voltage ($V_{OH}$) is output to the output terminal $D_O$, whereas a low level voltage ($V_{OL}$) is output to the output terminal $X_{DO}$.

When the input signal $V_{IN}$ is at a low level, any output signal of the buffer 11 is at a low level, while any output signal of the inverter 12 is at a high level. In this structure, the P-MOSFET $P_1$ is ON, the N-MOSFET $N_1$ is OFF, the P-MOSFET $P_2$ is OFF, the N-MOSFET $N_2$ is ON. Thus, the output current I flows through a path along the P-MOSFET $P_{C1}$, the P-MOSFET $P_1$ and the N-MOSFET $N_2$. At this time, a low level voltage ($V_{OL}$) is output to the output terminal $D_O$, whereas a high level voltage ($V_{OH}$) is output to the output terminal $X_{DO}$.

In the interface circuit, illustrated in FIG. 6, according to the first embodiment, likewise in the first example shown in FIG. 1, the P-MOSFET $P_{X1}$ of the bias circuit 2 and the P-MOSFET $P_{CL}$ of the drive circuit 1 are operable in their saturation range, and the dimensions of the respective transistors are designed in such a way that their constants are set at a predetermined ratio.

Applied to the gate of the P-MOSFET $P_{C1}$ of the drive circuit 1 is a voltage $V_{OP}$ having the same voltage value as that to be applied to the gate of the P-MOSFET $P_{X1}$ of the bias circuit 2. The P-MOSFET $P_{X1}$ and the P-MOSFET $P_{C1}$ are operable under a Miller effect, thus current values of the current $I_{RP}$ flowing through the P-MOSFET $P_{X1}$ and of the current I flowing through the P-MOSFET $P_{C1}$ are in proportion to each other.

When on-state resistance of the P-MOSFET $P_{X11}$ increases owing to a variation in a source voltage $V_{DD}$ or any difference (derivation) occurring in transistors in the manufacturing processes, a gate voltage $V_{OP}$ of the P-MOSFET $P_{X11}$ increases, resulting in decreasing the on-state resistance. On the contrary, when the on-state resistance of the P-MOSFET $P_{X11}$ decreases, the gate voltage $V_{OP}$ of the P-MOSFET $P_{X11}$ decreases, resulting in increasing the on-state resistance.

Accordingly, by the operations of the sense amp 21 which constantly controls the current $I_{RP}$ to flow, a variation in the current $I_{RF}$, as a result of any variation in the source voltage $V_{DD}$ or any difference occurring in the transistors in the manufacturing processes, can be controlled. Similarly, any variation in the output current I, flowing through the drive circuit 1 which current is proportional to the current $I_{RP}$ flowing through the bias circuit 2, can be controlled as well. Since such variation in the output current I can be reduced, the power to be consumed by the circuit can be maintained at an optimum value. Further, any variation in amplitude of the output voltage can be controlled, thus the transmission speed at which signals are to be transmitted can be retained at an optimum value.

In addition, the interface circuit according to the first embodiment can stably be operable, because it does not have the structure wherein the voltages applied to the output terminals $D_O$ and $X_{DO}$ included in the drive circuit 1 are fed back to the sense amp 21.

Accordingly, even if there are a plurality of the drive circuits 1 shown in FIG. 6, a gate voltage $V_{GP}$ can be applied to each constant current source P-MOSFET. Therefore, output currents I flowing through the respective P-MOSFETs can be controlled in the same manner.

In FIG. 6, the P-MOSFET $P_{C1}$ as a constant current source, as included in the drive circuit, is employed, however, an N-MOSFET may be adopted instead.

Figure 8:
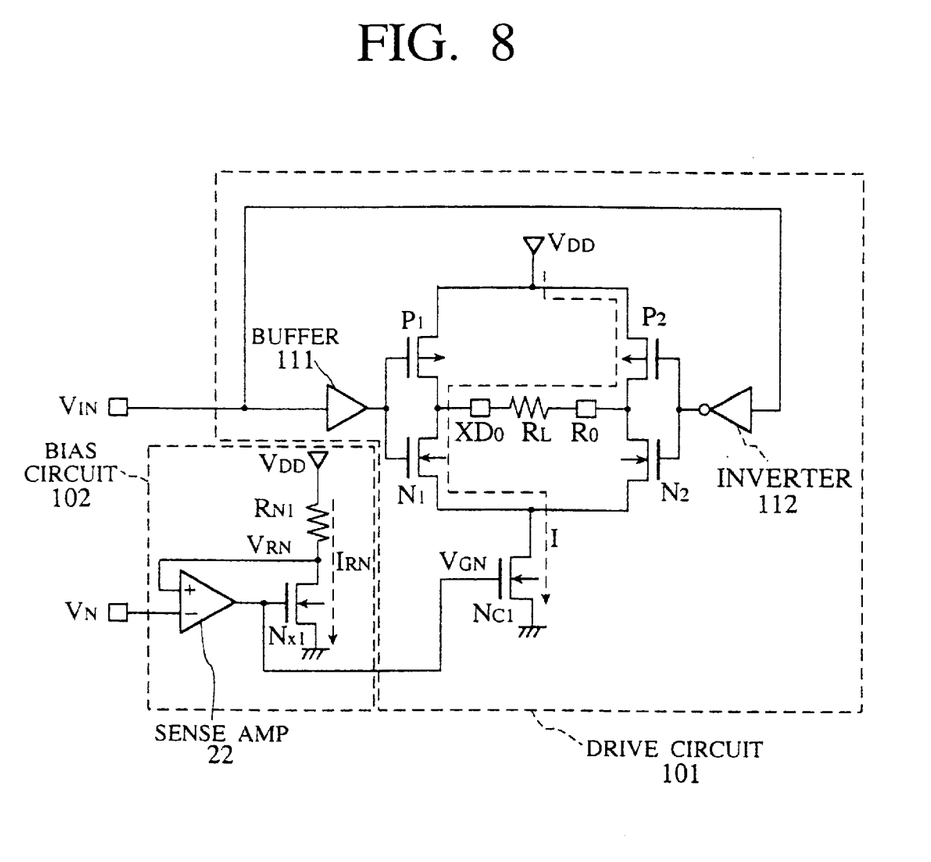
FIG. 8 is a circuitry diagram showing another structure of the interface circuit according to the first embodiment of the present invention.

FIG. 8 is a circuitry diagram showing another structure of the interface circuit according to the first embodiment of the present invention. The interface circuit illustrated in FIG. 8 comprises a drive circuit 101 and a bias circuit 102.

The drive circuit 101 comprises: a buffer 111 which performs non-inverting output of an input signal $V_{IN}$; an inverter 112 which performs inverting output of an input signal $V_{IN}$; a P-MOSFET $P_1$ and an N-MOSFET $N_1$ which are driven by the buffer 111; a P-MOSFET $P_2$ and an N-MOSFET $N_2$ which are driven by the inverter 112; and an N-MOSFET $N_{C1}$ serving as a constant current source for making an output current I flow to and through a terminating resister $R_1$ which is connected between two output terminals $D_O$ and $X_{DO}$.

The bias circuit 102 comprises: an N-MOSFET $N_{X1}$ and a fixed register $R_{N1}$ which are connected in series between a power source $V_{DD}$ and a ground potential; and a sense amp 22 which makes a constant current $I_{RN}$ flow through the N-MOSFET $N_{X1}$ and the fixed resistor $R_{N1}$.

Applied to an inverting input terminal of the sense amp 22 is a control voltage $V_N$ for making an output current 1 flow to and through the terminating resistor $R_1$. A voltage $V_{MN}$ output from the N-MOSFET $N_{X1}$ is fed back to a non-inverting input terminal of the sense amp 22. An output terminal of the sense amp 22 is connected to the gate of the N-MOSFET $N_{X1}$.

Second Embodiment

Figure 9:
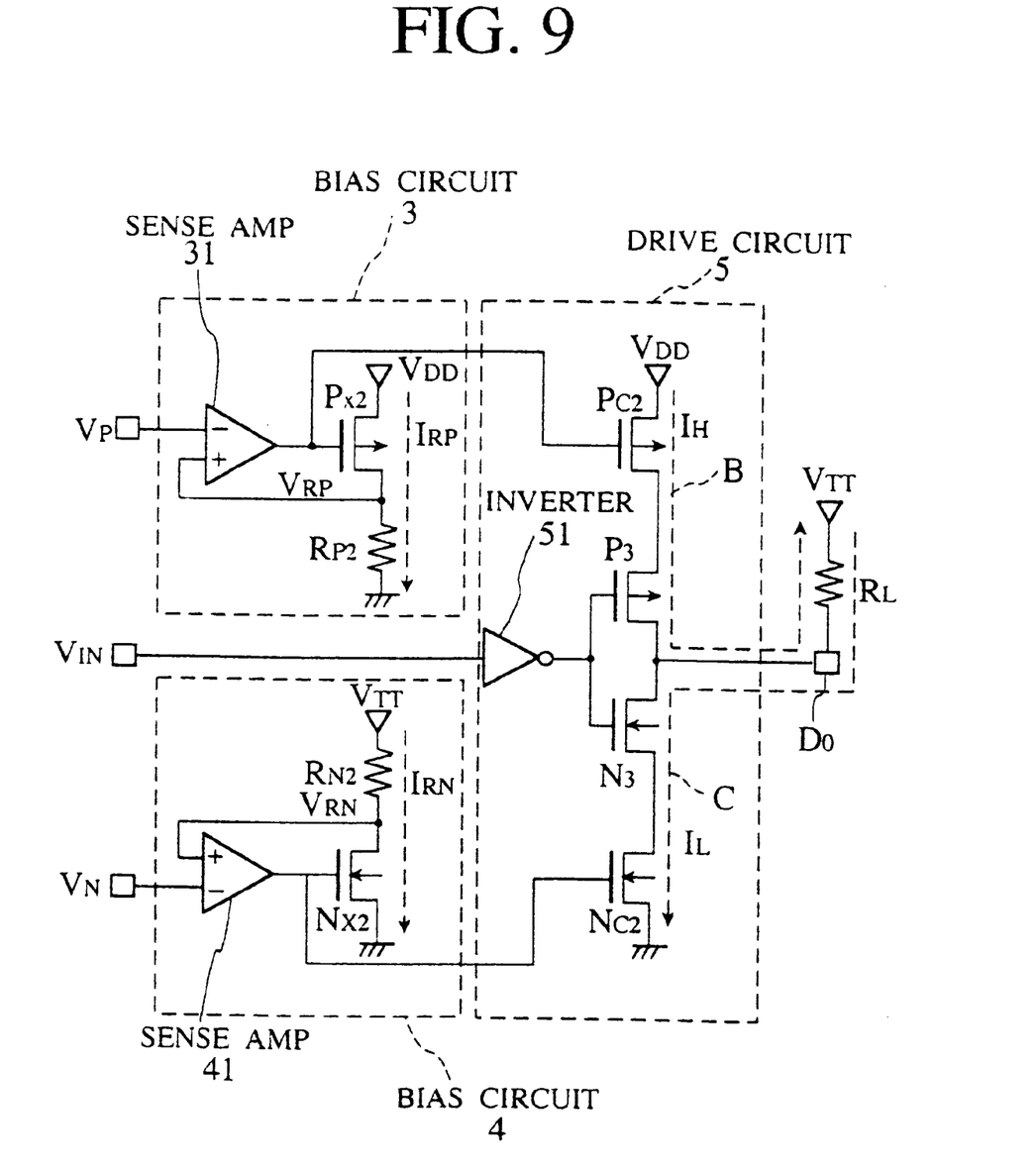
FIG. 9 is a circuitry diagram showing the structure of an interface circuit according to the second embodiment of the present invention.

FIG. 9 is a circuitry diagram showing the structure of an interface circuit according to the second embodiment of the present invention. The interface circuit, illustrated in FIG. 9, according to the second embodiment has the structure, in which an output terminal $D_O$ is connected to a reference voltage $V_{TT}$ at one end of a transmission path via a terminating resistor $R_L$. Further, the interface circuit comprises: a drive circuit 5 which makes an output current $I_L$ or $I_H$ flow to and through the terminating resistor $R_L$ and makes a voltage of the output terminal $D_O$ vary, in accordance with the conditions of an input signal $V_{IN}$; and bias circuits 3 and 4 which sends gate voltages for making a constant current flow to and through two constant current sources included in the drive circuit 5.

The drive circuit 5 comprises: a P-MOSFET $P_3$ and an N-MOSFET $N_3$ which are connected with each other i series; a P-MOSFET $P_{C2}$ which serves as a constant current source for making a predetermined output current $I_H$ flow to and through the terminating resistor $R_L$ via the P-MOSFET $P_3$ and the N-MOSFET $N_3$; N-MOSFET $N_{C2}$ which serves as a constant current source for making a predetermined output current $I_l$ flow to and through the terminating resistor $R_L$ via the P-MOSFET $P_3$ and the N-MOSFET $N_3$; and an inverter 51 which inverts an input signal $V_{IN}$ and applies gate voltages respectively to the P-MOSFET $P_3$ and the N-MOSFET $N_3$.

The bias circuit 3 comprises: a P-MOSFET $P_{X2}$ and a fixed resistor $R_P$ which are connected in series between a power source $V_{DD}$ and a ground potential; and a sense amp 31 which constantly controls a current $I_{RP}$ to flow to and through the P-MOSFETP$_{X2}$ and the fixed resistor $R_P$.

A control voltage $V_P$ corresponding to a predetermined output current $I_H$ flowing to the terminating resistor $R_L$ is applied to an inverting input terminal of the sense amp 31. An output voltage $V_{RP}$ output from the P-MOSFET P$_{X2}$ is applied to a non-inverting input terminal of the sense amp 31. An output terminal of the sense amp 31 is connected to the gate of the P-MOSFET P$_{X2}$. The bias circuit 3 sends a gate voltage to the gate of the P-MOSFET P$_{C2}$ so that a current $I_H$ constantly flow through the P-MOSFET P$_{C2}$.

The bias circuit 4 comprises: an N-MOSFET N$_{X2}$ and a fixed resistor $R_{N2}$ which are connected in series between a reference voltage $V_{TT}$ at one end of a transmission path and a ground potential; and a sense amp 41 which constantly controls a current $I_{RN}$ to flow to and through the N-MOSFET N$_{X2}$ and the fixed resistor $R_{N2}$.

A control voltage $V_N$ corresponding to a predetermined output current $I_L$ flowing to the terminating resistor $R_L$ is applied to an inverting input terminal of the sense amp 41. An output voltage $V_{RN}$ output from the N-MOSFET N$_{X2}$ is fed back to a non-inverting input terminal of the sense amp 41. An output terminal of the sense amp 41 is connected to the gate of the N-MOSFET N$_{X2}$. The bias circuit 4 sends a gate voltage to the gate of N-MOSFET N$_{C2}$ so that a current $I_L$ constantly flows to and through the N-MOSFET N$_{C2}$.

Figure 10:
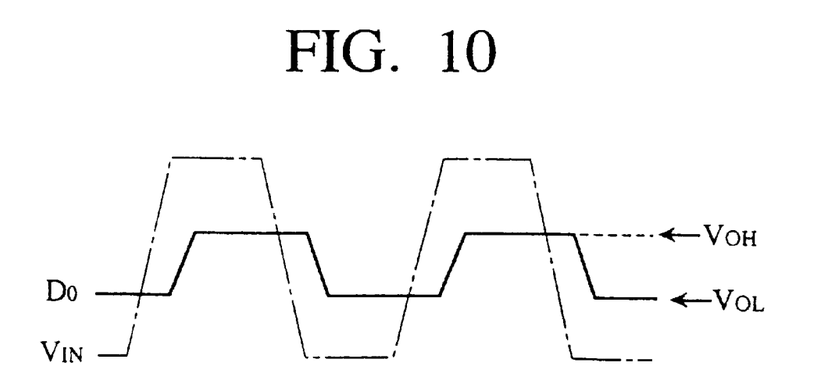
FIG. 10 is an input-output waveform diagram showing operations of the interface circuit shown in FIG. 9.

FIG. 10 is an input-output waveform diagram showing operations of the interface circuit shown in FIG. 9. As illustrated in FIG. 10, when an input signal $V_{IN}$ is at a high level, a low level signal is output from an inverter 51, and the P-MOSFET P$_3$ is ON, whereas the N-MOSFET N$_3$ is OFF. Accordingly, as shown with arrow B in FIG. 9, the output current $I_H$ flows to the terminating resistor $R_L$ via the P-MOSFET P$_{C2}$ and the P-MOSFET$_3$, thereafter a high level signal ($V_{OH}$) is output to the output terminal D$_O$. When the input signal $V_{IN}$ is at a low level, a high level signal is output from the inverter 51, and the P-MOSFET P$_3$ is OFF, whereas the N-MOSFET N$_3$ is ON. Accordingly, the output current $I_L$, as shown with an arrow C in FIG. 9, flows to the terminating resistor $R_L$ via the N-MOSFET N$_{C2}$ and the N-MOSFET N$_3$, thereafter a low level signal ($V_{OL}$) is output to the output terminal D$_O$.

The sense amp 31 included in the bias circuit 3 is operable in such a way that the output voltage $V_{RP}$ of the P-MOSFET P$_{X2}$ and the control voltage $V_P$ coincide with each other. Thus, the current $I_{RP}$ flowing to the fixed resistor $R_{P2}$ is always and constantly controlled without being effected by any variation in the source voltage $V_{DD}$ or any difference occurring in transistors in the manufacturing processes.

The P-MOSFET P$_{X2}$ of the bias circuit 3 and the P-MOSFET P$_{C2}$ of the drive circuit 5 are operable in their saturation range, and their dimensions are designed so as their constants to be set at a predetermined ratio. In such a structure, the P-MOSFET P$_{X2}$ and the P-MOSFET P$_{C2}$ are operable under a Miller effect, thus a current value of the current $I_{RP}$ flowing to the P-MOSFET P$_{X2}$ and a current value of the current $I_H$ flowing to the P-MOSFET P$_{C2}$ are in proportion to each other.

The sense amp 41 of the bias circuit 4 is operable in such a way that the output voltage $V_{RN}$ of the N-MOSFET N$_{X2}$ and the current voltage $V_N$ coincide with each other. Thus, the current $I_{RN}$ flowing to the fixed resistor $R_{N2}$ is always constantly controlled without being effected by any variation in the source voltage or any difference occurring in transistors in the manufacturing processes.

The N-MOSFET N$_{X2}$ of the bias circuit 4 and the P-MOSFET N$_{C2}$ of the drive circuit 5 are operable in their saturation range, and the dimensions of the respective transistors are designed so that their constants are set at a predetermined ratio. Thus, the N-MOSFET N$_{X2}$ and the N-MOSFET N$_{C2}$ are operable under a Miller effect, a current value of the current $I_{RP}$ flowing to the N-MOSFET N$_{X2}$ and a current value of the current $I_L$ flowing to the N-MOSFETP N$_{C2}$ are in proportion to each other.

As illustrated in FIG. 9, the bias circuit 3 includes the sense amp 31 which constantly controls the current $I_{RP}$ to flow to the fixed resistor $R_{P2}$, any variation in a current $I_{RP}$, as a result of a variation in a source voltage $V_{DD}$ or any difference (deviation) occurring in transistors in the manufacturing processes, can be reduced. Thus, any variation in the output current $I_H$ of the drive circuit 5, whose value is proportional to the value of the current $I_{RP}$, can also be reduced.

The bias circuit 4 includes the sense amp 41 which constantly controls the current $I_{RN}$ to flow to the fixed resistor $R_{N2}$, reducing any variation in the current $I_{RN}$ as a result of a variation in the source voltage $V_{DD}$ or any difference (deviation) occurring in transistors during the manufacturing processes. This achieves a reduction in a variation in the output current $I_L$ of the drive circuit 5 whose value is proportional to the current $I_{RN}$.

The interface circuit according to the second embodiment does not have the structure of the second example, shown in FIG. 2, in which voltages of the output terminals D$_O$ and X$_{DO}$ included in the drive circuit are fed back to the sense amp. Thus, the interface circuit according to the second embodiment is operably always in a stable manner. Thus, unlike the second example, no noise occurs in the interface circuit according to the second embodiment.

As explained above, according to the prevent invention, a value of a control voltage for constantly controlling an output current to flow and a value of an output voltage of a transistor included in the bias circuit are controlled to be at a predetermined ratio, by the differential amplifier. By doing this, the current flowing to and through the fixed resistor and the current flowing to the transistors in the bias current are constantly controlled to flow, reducing any variation in the circuit which variation may occur as a result any variation in the source voltage or any difference occurring in transistors in the manufacturing processes.

According to the structure of the present invention, a reduction in a variation in the current flowing to the transistor which is operable under a Miller effect together with the transistors in the bias circuit can be achieved, and a reduction in a variation in the current flowing to the terminating resistor can be achieved.

Because the voltage of the output terminal is not fed back to the differential amplifier, such an amplifier can be operable always in a stable manner, preventing any noise from occurring in the amplifier.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invasion and within the claims are to be regarded to be in the scope of the present invention.

This application is based on Japanese Patent Application No. H11-149787 filed on May 28, 1999, and including specification, claims, drawings and summary. The disclosure of the above Japanese Patent Application is incorporated herein by reference in its entirety.

What is claimed is:

1. An interface circuit which outputs an output signal in accordance with an input signal to at least one end of a load, said interface circuit comprising:
   said load;
   a driving circuit having a first transistor which supplies a first constant current to a switching circuit which supplies said first constant current to said load; and
   a bias circuit comprising:
      a fixed resistor;
      a second transistor which is connected with said fixed resistor and which is operable with said first transistor under a Miller effect; and
      a control circuit which controls a voltage applied to control terminals of said first and second transistor and an output voltage of said second transistor to be at a predetermined voltage ratio.

2. The interface circuit according to claim 1, wherein:
   each of said first and second transistor includes a current path and a control terminal;
   said current path of said first transistor is connected to said switching circuit;
   said current path of said second transistor is connected to said fixed resistor; and
   wherein said control circuit comprises:
      a differential amplifier whose inverting input terminal receives a predetermined voltage, and whose non-inverting input terminal receives a voltage of a connection node between said second transistor and said fixed resistor, and
      an output terminal which applies an output voltage at said control terminals of said first and second transistor.

3. The interface circuit according to claim 1, wherein,
   said switching circuit switches a flow direction of a current flowing through said load from one end to the other end and from the other end to the one end.

4. The interface circuit according to claim 1, further comprising:
   a second driving circuit having a third transistor which supplies a second constant current to said load and a second switching circuit which supplies said second constant current to said load;
   a second bias circuit having a second fixed resistor, a fourth resistor which is connected with said second fixed resistor and which is operable with said third transistor under a Miller effect; and a second control circuit which controls a voltage applied to said control terminals of said third and fourth transistors and an output voltage of said fourth transistor to be at a predetermined voltage ratio.

5. The interface circuit according to claim 4, wherein:
   each of said third and fourth transistors includes a current path and a control terminal;
   said current path of said third transistor is connected to said second switching circuit;
   said current path of said fourth transistor is connected to said second fixed resistor;
   said interface circuit further comprises:
      a second differential amplifier whose inverting input terminal receives a second predetermined voltage, and whose non-inverting input terminal receives a voltage of a connection node between said fourth transistor and said second fixed resistor; and
      an output terminal which applies an output voltage at said control terminals of said third and fourth transistors.

6. The interface circuit according to claim 1, wherein
   said first and second transistors respectively comprise P-channel MOSFET's or N-channel MOSFET's.

7. The interface circuit according to claim 4, wherein
   each of said first and second transistors respectively comprise P-channel MOSFET's or N-channel MOSFET's; and
   said third and fourth transistors respectively comprise N-channel MOSFET's or P-channel MOSFET's.

8. An operating method of an interface circuit which outputs an output signal in accordance with an input signal to at least one end of a load, said operating method comprising:
   controlling and applying a common voltage to gates of a first transistor and a second transistor whose current path is connected to a resistor so that a voltage at a connection point of said resistor and said second transistor is a predetermined value, thereby to make said fist and second transistors operate under a Miller effect; and
   supplying, in response to said input signal, a current which flows through said first transistor and a switching circuit to said load, thereby outputting said output signal between both ends of said load or at one end of said load.

9. The operating method of an interface circuit according to claim 8, further comprising:
   controlling and applying a second common voltage to gates of a third transistor and a fourth transistor whose current path is connected to a second resistor so that a voltage at a connection point of said second resistor and said fourth transistor is a second predetermined value, thereby to make said third and fourth transistors operate under a Miller effect; and
   supplying, in response to said input signal, a current which switchingly flows through said first transistor and said third transistor to said load.

* * * * *